United States Patent
Neuman

(10) Patent No.: US 7,365,548 B2
(45) Date of Patent: Apr. 29, 2008

(54) SYSTEM AND METHOD FOR MEASURING ON-CHIP SUPPLY NOISE

(75) Inventor: Darren Neuman, Palo Alto, CA (US)

(73) Assignee: Broadcom Corporation, Irvine, CA (US)

( * ) Notice: Subject to any disclaimer, the term of this patent is extended or adjusted under 35 U.S.C. 154(b) by 65 days.

(21) Appl. No.: 11/154,388

(22) Filed: Jun. 16, 2005

(65) Prior Publication Data

US 2007/0007970 A1    Jan. 11, 2007

(51) Int. Cl.
*G01R 29/26* (2006.01)
(52) U.S. Cl. ...................................... 324/613
(58) Field of Classification Search ................. 324/613
See application file for complete search history.

(56) References Cited

U.S. PATENT DOCUMENTS

| | | | |
|---|---|---|---|
| 6,603,293 B2 * | 8/2003 | Knoedgen | 323/280 |
| 6,717,445 B1 * | 4/2004 | Nair | 327/112 |
| 6,823,293 B2 * | 11/2004 | Chen et al. | 324/763 |
| 2005/0122138 A1 * | 6/2005 | Chansungsan et al. | 327/78 |
| 2006/0214672 A1 * | 9/2006 | Jenkins et al. | 324/713 |

FOREIGN PATENT DOCUMENTS

WO    WO 2004/077315 A1 *    9/2004

* cited by examiner

*Primary Examiner*—Andrew H. Hirshfeld
*Assistant Examiner*—Timothy J Dole
(74) *Attorney, Agent, or Firm*—McAndrews, Held & Malloy, Ltd.

(57) ABSTRACT

A method and system for measuring noise of an on-chip power supply. In an embodiment, the system comprises a delay line that receives as an input a signal such as a square wave. The delay line may comprise a series of inverters connected to the power supply. The output of the delay line may combine the input signal and the noise signal from the power supply to produce a series of delayed versions of the input signal. Analysis of the output signal yields characteristics associated with the noise signal of the power supply such as its spectrum. In another embodiment, the system may comprise at least one mixer that modulates an input signal, such as a sinusoid, with the noise signal of the power supply. Demodulating the mixed signal then yields the noise signal of the power supply for further analysis.

19 Claims, 4 Drawing Sheets

US 7,365,548 B2

SYSTEM AND METHOD FOR MEASURING ON-CHIP SUPPLY NOISE

RELATED APPLICATIONS

Not Applicable

FEDERALLY SPONSORED RESEARCH OR DEVELOPMENT

Not Applicable

MICROFICHE/COPYRIGHT REFERENCE

Not Applicable

BACKGROUND OF THE INVENTION

Circuits built on chips, generally have on-chip power supplies. On-chip power supplies generate noise, to which circuits coupled thereto are somewhat sensitive. Some components can be greatly affected by the power supply noise, such components as phase-locked loops (PLLs), for which it is pertinent to know whether the supply noise has any spectrum. For example, if a power supply has noise that causes oscillation at 10 kHz, and that power supply feeds a PLL that is trying to put out a 1 MHz signal from some source, the 10 kHz power supply noise will end up modulated on-top of the 1 MHz output. As a result the output of the PLL-Will contain jitter. This jitter may cause circuits relying on the accuracy of a clean signal from the PLL to malfunction.

There is an interest in knowing how a circuit is really performing, but with the power supply noise affecting the performance of the circuit, the real performance of the circuit is often difficult to determine. It is especially difficult to probe the power supply inside the chip, so determining the level and spectrum of the power supply has proven difficult.

In measuring the noise of the power supply, measuring the DC component of the noise is simple, and can be done by measuring the voltage associated with the noise of the power supply. More difficult, however, is determining the high frequency content of the noise signal of the power supply, and hence its spectrum independent of the effects of other components of the circuit.

Existing solutions simply output the power supply pins for external measurements. The problem with such an approach is that the power supply is often disrupted by external equipment, board layout, and package concerns. Therefore, it is difficult to determine the on-chip noise level, and measure the noise without affecting the noise itself. Even more difficult is measuring high frequency noise caused by the power supply that can occur on the chip.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for measuring on-chip supply noise, substantially as shown in and/or described in connection with at least one of the figures, as set forth more completely in the claims.

These and other features and advantages of the present invention may be appreciated from a review of the following detailed description of the present invention, along with the accompanying figures in which like reference numerals refer to like parts throughout.

DETAILED DESCRIPTION OF THE INVENTION

Certain embodiments of the present invention relate to measurements associated with circuits and on-chip signals. More specifically, certain embodiments of the present invention related to a system and method for measuring on-chip supply noise. An embodiment of the present invention may comprise a box that may be connected to a power supply on a chip. The box may give an indication of the power supply noise, or a signal indicating a measure of the power supply noise.

Figure 1A:
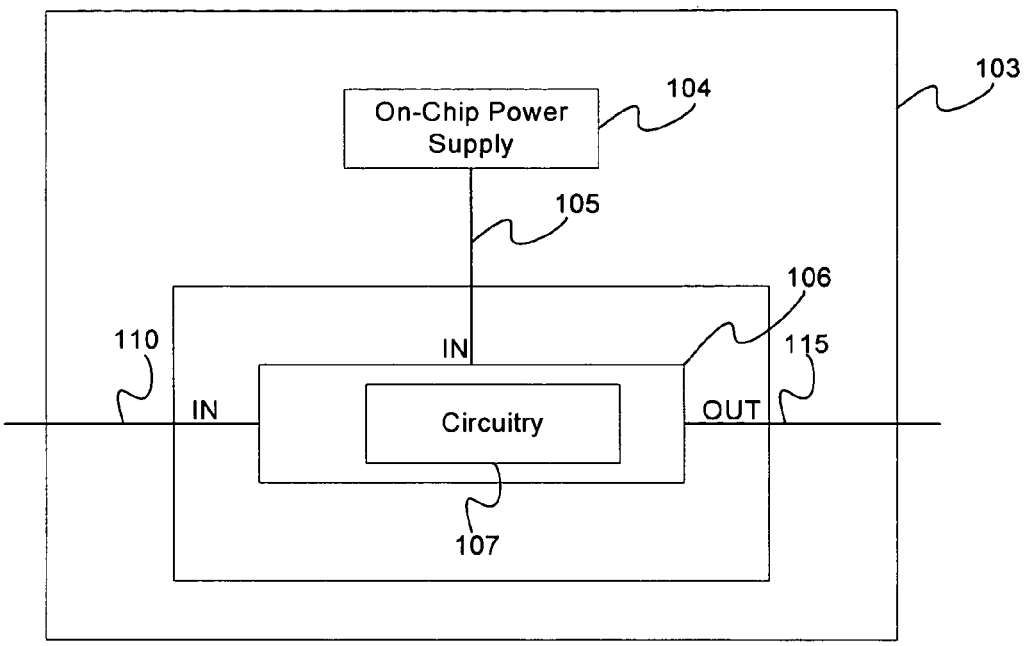
FIG. 1a illustrates a block diagram of an exemplary power supply noise measuring circuit, in accordance with an embodiment of the present invention.

FIG. 1a illustrates a block diagram of an exemplary system for measuring power supply noise on a chip 103. The chip 103 may comprise an on-chip power supply 104 and an on-chip noise measurement module 106. The on-chip noise measurement module 106 may comprise circuitry 107, input ports 105 and 110, and an output port 115. The input port 105 may couple the on-chip power supply 104 to the circuitry 107 within the on-chip noise measurement module 106.

Figure 1B:
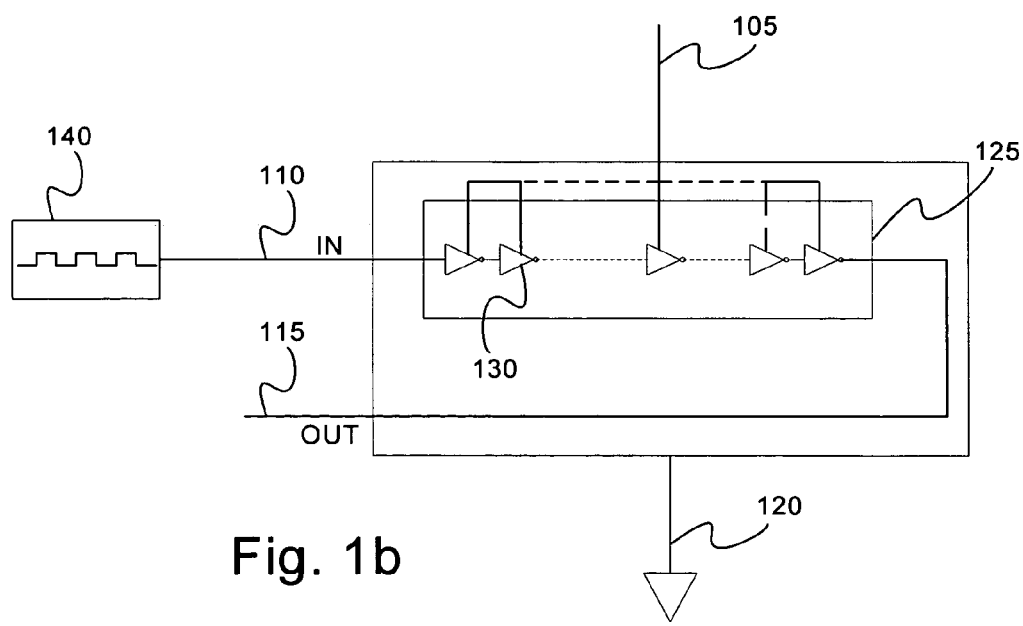
FIG. 1b illustrates a block diagram of an exemplary power supply noise-measuring module of FIG. 1a, for example, in accordance with an embodiment of the present invention.

FIG. 1b illustrates a block diagram of the exemplary power supply noise-measuring module 106 of FIG. 1a, for example, in accordance with an embodiment of the present invention. The power supply noise-measuring module may comprise an input port 110, a delay line 125, and an output port 115. The input port 110 may be coupled to a pin on the chip 103, and the output port 115 may be coupled to a pin on the chip 103. To minimize pin usage on the chip 103, the input port 110 and the output port 115 may be coupled to general-purpose pins on the chip 103 rather than dedicated pins. The circuit-may be also connected to a ground 120. The delay line 125 may be connected to the on-chip power supply 104 of the on-chip power supply for which noise on the output needs to be measured. In exemplary embodiments of the present invention, the power supply 104 may be an analog supply or a timing-critical power supply.

In an embodiment of the present invention, the delay line 125 may comprise a plurality of serially coupled inverters 130, where all the inverters may be powered by the same on-chip power supply 104. The delay through the inverters 130 may depend on the voltage of the on-chip power supply 104. To isolate the noise of the power supply 104, the input port 110 and the output port 115 drivers may be stable supplies such that they do not affect the measured noise on the delay line 125. In an embodiment of the present invention, the number of the inverters 130 may be a large number such as, for example, 100 inverters or 1000 inverters.

The delay line 125 may be utilized to modulate a known clock signal (the input 110) with the power supply noise (power supply 104). The modulated signal (output 115) may then be transmitted off chip with very little or no signal loss, and may then be analyzed to measure the magnitude and spectrum of the power supply noise.

Verification of the noise generation may be achieved by turning on and off other circuits on the same chip. When these other circuits are turned on and off dynamically, the modulation of the noise may be affected. If the modulation of the noise is significantly altered when other circuits are active, that may be an indication of occurrence of cross coupling in the power supply 104, where there may be another component on the chip connected to the power supply 104 and affecting the noise level on the power supply 104.

Figure 2:
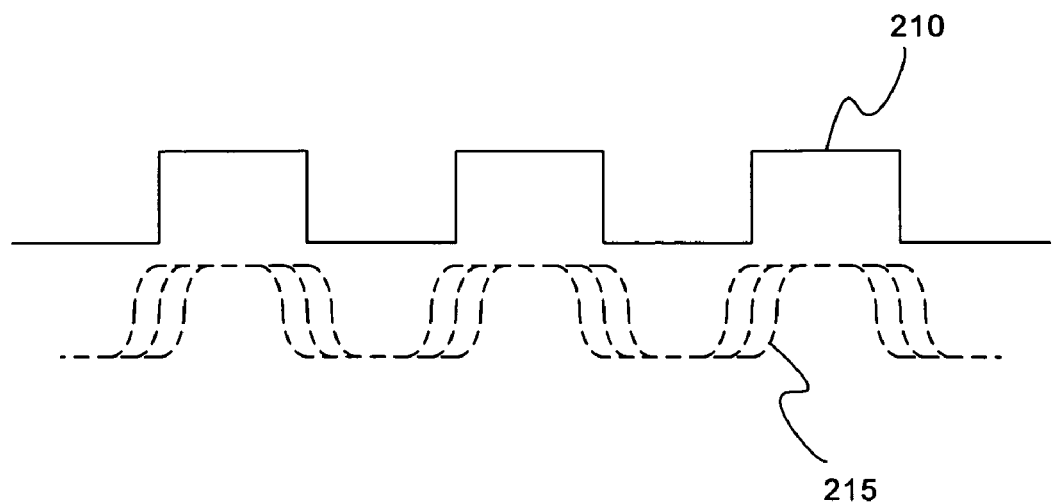
FIG. 2 illustrates a plot of an exemplary input and output of the power supply noise measuring circuit, in accordance with an embodiment of the present invention.

FIG. 2 illustrates a plot of an exemplary input and output of the power supply noise measuring circuit, in accordance with an embodiment of the present invention. The input signal 210 may be, for example, a square wave. A stable clock generator 140 may be utilized as the input signal 210, which may be fed into an input port of the on-chip measuring module 106 such as, for example, the input port 110 of FIG. 1$a$. The output port, such as, for example, output port 115, may then be observed for jitter and spurs. For example, when the input signal 210 is generated by a clock, the output signal 215 may be compared to the input signal 210 to determine the amount of jitter caused by the noise generated by the power supply.

The output signal 215 may comprise delayed versions of the input signal 210, where the delays may be indicative of the characteristics of the noise signal of the power supply. The output signal 215 may then be compared to the input signal 210, for example, using a jitter meter or by performing a fast Fourier transform (FFT) on the difference between the two signals. This may be based on the assumption that any jitter introduced to the output signal 215 as compared to the input signal 210 may be caused by the voltage supply on the delay line 125. The magnitude and spectrum of the jitter may be directly proportional to the magnitude and spectrum of the power supply noise.

Figure 3:
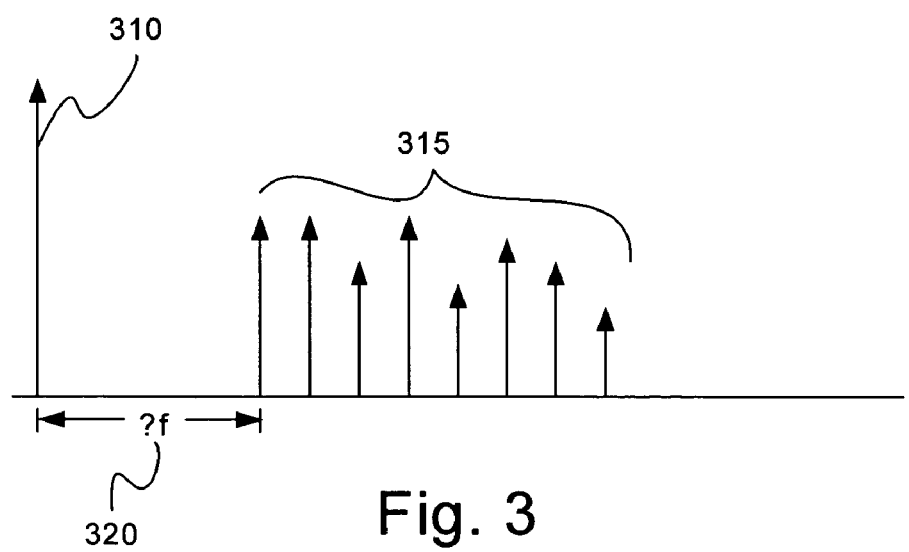
FIG. 3 illustrates an exemplary frequency representation of an output signal, in accordance with an embodiment of the present invention.

FIG. 3 illustrates an exemplary frequency representation of an output signal, in accordance with an embodiment of the present invention. To analyze the output signal as compared to the input signal, an instrument such as, for example, a spectrum analyzer may be utilized. When looking at the frequencies representing the output signal, the spike 310 representing the input frequency corresponding to, for example, the input signal 210, which in this example is a square wave, may have the largest amplitude. In addition to the frequency representing the input signal 210, a group of frequencies 315 will also appear, with smaller amplitudes, representing side band signals generated as a result of the noise signal. The distances between the frequency spike 310 representing the input signal and the smaller side frequency spikes 315 representing the power supply noise signal may represent the spectrum of the jitter on the power supply.

The noise on the power supply may be a pure tone at some frequency $f_N$. In that case, the difference between the frequency spike 310 and the first harmonic, $\Delta f$ 320 may be equal to $f_N$. For example, if there is a 10 kHz pure tone on the power supply, then $\Delta f$ 320 will be 10 kHz. In instances where the noise on the power supply is random, the side bands 315 are flat and may be used to estimate the magnitude of the noise relative to the input, by examining the power of the output signal 310 and the side bands 315. In instances where the input signal 210 is a sine wave, an FFT of higher quality may result, since the harmonics of the sine wave may differ from the harmonics of a square wave.

Figure 4:
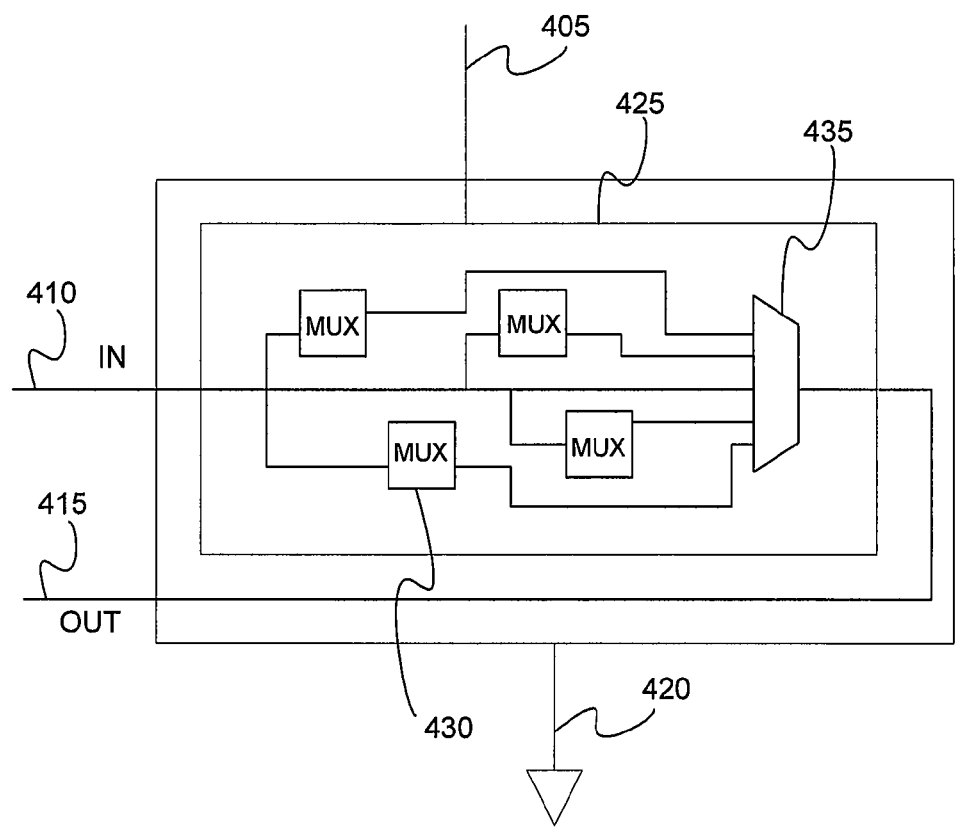
FIG. 4 illustrates a block diagram of another exemplary power supply noise measuring circuit, in accordance with an embodiment of the present invention.

FIG. 4 illustrates a block diagram of another exemplary power supply noise measuring circuit, in accordance with an embodiment of the present invention. The power supply noise measuring circuit may comprise an input port 410, an analog modulator 425, and an output port 415. The circuit may be also connected to a ground 420. The analog modulator 425 may be connected to the power supply 104 of the on-chip power supply for which noise on its output is to be measured. The analog modulator 425 may mix the power supply 104 (FIG. 1$a$) with the input signal 410.

The analog modulator 425 may comprise a MUX 430, which may have as an input a signal from the input port 410 and the power supply 104 via another input port 405. The output of the MUX 430 may yield the output 415, which may comprise the noise from the power supply 104 modulated on the input signal 410. The output 415 may then be analyzed to determine the characteristic of the power supply noise.

In an embodiment of the present invention, there may be multiple power supplies 104 integrated on the chip. In such an embodiment, each of the power supplies 104 may be mixed with the input signal 410 using the MUX 430. The outputs of all the MUXs 430 may then be multiplexed using an analog MUX 435 and any one of the inputs to the MUX 435 may be selected to generate the output 415. The output 415 may then have the input signal 410 modulated with the power supply noise of interest, and may then be analyzed to determine the characteristics associated with the noise signals of all the power supplies 104 on the chip. In an embodiment of the present invention, the output 415 may be mixed again with the input signal 410, which demodulates the output signal, and thereby resulting in a signal that is just the noise of the power supply 104.

Figure 5:
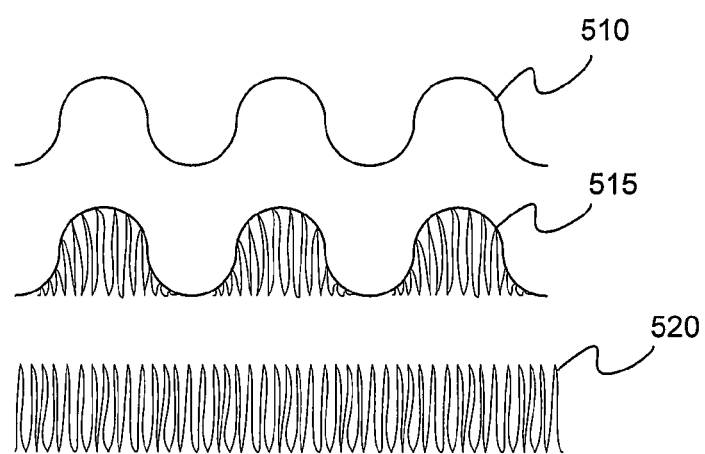
FIG. 5 illustrates a plot of another exemplary input and output of the power supply noise measuring circuit, in accordance with an embodiment of the present invention.

FIG. 5 illustrates a plot of another exemplary input and output of the power supply noise measuring circuit, in accordance with an embodiment of the present invention. The input signal 510 may be, for example, a sinusoid wave, which may be fed into an input port of the measuring circuit such as, for example, the input port 410 of FIG. 4. The output port such as, for example, output port 415 may then be observed for the mixed signal of the input signal and the noise signal of the power supply 104. Mixing the input signal 510 with the power supply may result in a signal that may be a signal of the input signal 510 modulated with the noise signal of the power supply.

The output signal 515 may then be demodulated using the input signal itself, which may result in isolating the noise signal 520 of the power supply. The noise signal 520 may then be analyzed by, for example, a spectrum analyzer to determine the characteristics associated with the noise signal

520. Such characteristics may comprise, for example, the magnitude and frequency (or frequencies) associated with the noise signal 520.

In one embodiment of the invention, an on-chip noise measurement system that measures noise associated with an on-chip power supply is provided. Referring to FIG. 1a and FIG. 1b, the on-chip noise measurement system may comprise an on-chip measurement module 106. The on-chip measurement module 106 may comprise a first input port 110, a second input port 105 and an output port 115.

The first input port 110 may be coupled so that it receives an input signal and the second input port 105 may be coupled so that it receives a power supply output signal that is generated by the on-chip power supply 104. The on-chip measurement module 106 may comprise suitable circuitry that is adapted to combine the input signal 110 and the power supply output signal generated by the on-chip power supply 104. The output port 115 may communicate an output signal representative of the combined input signal and the power supply output signal out of the on-chip measurement module 106. The output signal generated from the on-chip measurement module 106 is indicative of the characteristics of the noise associated with the on-chip power supply 104.

The circuitry 106 may comprise a plurality of inverters 130 in series, wherein the input signal 110 may be input into the first of the plurality of inverters 130, and each of the plurality of inverters 130 may be powered by the power supply 104. The input signal 110 may comprise a square wave or other waveform. Using the inverters 130 may cause the output signal 115 to be a combination of delayed versions of the input signal. Utilizing spectrum analysis of the output signal 115 may show the characteristics of the noise associated with the power supply output signal. The characteristics of the noise associated with the power supply may comprise a magnitude and phase of the noise in the frequency domain.

The circuitry 106 may comprise at least one mixer that mixes the input signal 110 and the power supply 104. The input signal 110 may be, for example, a sinusoidal signal and the output signal 115 may be the sinusoidal signal modulated with the noise associated with the power supply. The noise associated with the power supply may then be retrieved by demodulating the output signal 115 with the input signal 110.

Figure 6:
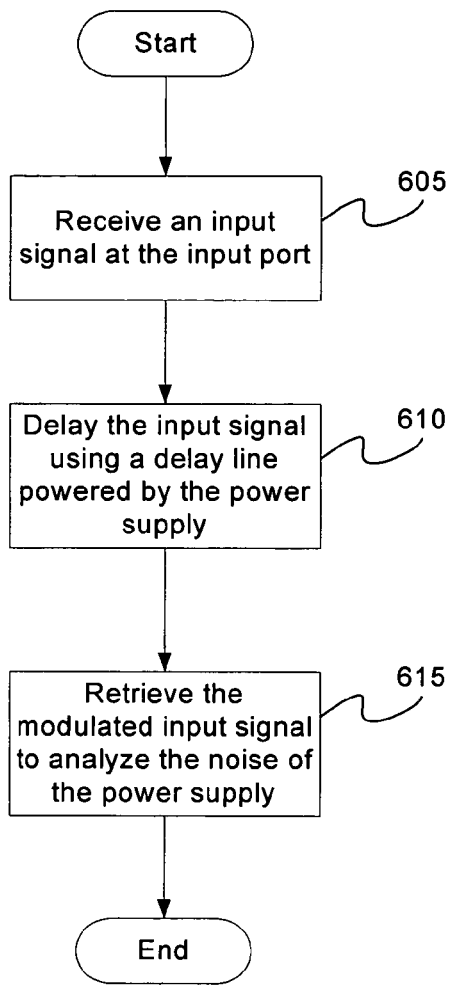
FIG. 6 illustrates a flow chart of an exemplary method of on-chip power supply noise measurement, in accordance with an embodiment of the present invention.

FIG. 6 illustrates a flow chart of an exemplary method of on-chip power supply noise measurement, in accordance with an embodiment of the present invention. The noise measurement of FIG. 6 may be performed by a system such as, for example, the system illustrated in FIG. 1a and FIG. 1b. At 605 an input signal such as, for example, a square clock signal may be received by an input port such as, for example, the input port 110 of FIG. 1a of the noise measurement module 106. At 610, a line delay circuit such as, for example, the line delay 125, may delay the input signal. The delay line 125 may be powered by the on-chip power supply the noise of which the noise measurement module seeks to measure. The output may then be the input signal modulated with the power supply noise and may be retrieved for analysis at 615. Analyzing the modulated signal may yield characteristics associated with the noise of the power supply such as, for example, magnitude and frequency.

Figure 7:
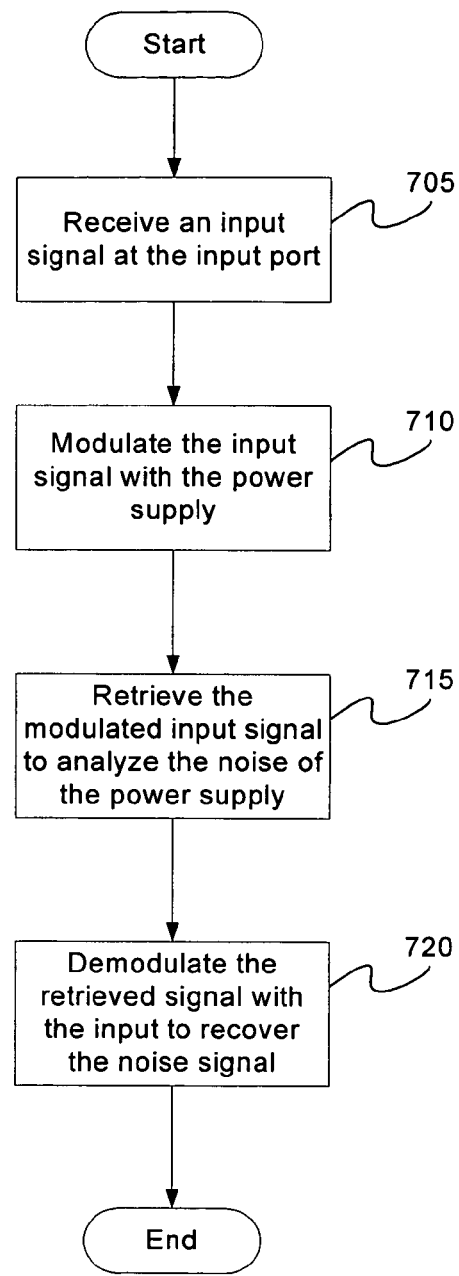
FIG. 7 illustrates a flow chart of another exemplary method of on-chip power supply noise measurement, in accordance with an embodiment of the present invention.

FIG. 7 illustrates a flow chart of another exemplary method of on-chip power supply noise measurement, in accordance with an embodiment of the present invention. The noise measurement of FIG. 7 may be performed by a system such as, for example, the system illustrated in FIG. 1a and FIG. 4. At 705 an input signal such as, for example, a sinusoid, and a signal from the on-chip power supply may be received by an input port such as, for example, the input port 110 of FIG. 1a of the noise measurement module 106. At 710, an analog modulator such as, for example, the analog modulator 425 of FIG. 4 may be used to modulate the input signal and the signal from the power supply. The output may then be the input signal modulated with the power supply noise and may be retrieved for analysis at 715. At 720 the modulated output signal may be demodulated using the sinusoidal input signal, hence leaving for analysis the signal representing the noise of the on-chip power supply. Analyzing the modulated signal may yield characteristics associated with the noise of the power supply such as, for example, magnitude and frequency.

In an embodiment of the present invention, there may be multiple power supplies integrated on the chip. In such an embodiment, each of the power supplies may be modulated with the input signal. All the modulated signals may then be multiplexed using an analog MUX 435 and any one of the modulated signals may be selected to generate an output. The output may then have the input signal modulated with the power supply noise of interest, and may then be analyzed to determine the characteristics associated with the noise signals of all the power supplies on the chip. In an embodiment of the present invention, the output may be demodulated with the input signal, and thereby resulting in a signal that is just the noise of the power supply.

Accordingly, the present invention may be realized in hardware, software, or a combination thereof. The present invention may be realized in a centralized fashion in at least one computer system, or in a distributed fashion where different elements may be spread across several interconnected computer systems. Any kind of computer system or other apparatus adapted for carrying out the methods described herein may be suited. A typical combination of hardware and software may be a general-purpose computer system with a computer program that, when being loaded and executed, may control the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. An on-chip noise measurement system that measures noise associated with an on-chip power supply, the system comprising:

an on-chip measurement module comprising:

a first input port for receiving an input signal;

a second input port that is coupled to the on-chip power supply;

circuitry that combines the input signal and a power supply output signal generated by the on-chip power supply; and an output port that communicates an output signal representative of the combined input signal and the power supply output signal, wherein the output signal indicates characteristics of the noise associated with the on-chip power supply, wherein the circuitry demodulates the output signal with the input signal to extract the noise associated with the power supply.

2. The system according to claim 1, wherein the circuitry comprises a plurality of inverters in series, wherein the input signal is input into the first of the plurality of inverters, and each of the plurality of inverters is powered by the power supply.

3. The system according to claim 2, wherein the input signal comprises a square wave.

4. The system according to claim 2, wherein the output signal comprises a combination of delayed versions of the input signal.

5. The system according hto claim 4, wherein spectrum analysis of the output signal indicates the characteristics of the noise associated with the power supply output signal.

6. The system according to claim 1, wherein the characteristics of the noise associated with the power supply comprise a magnitude and phase of the noise in the frequency domain.

7. The system according to claim 1, wherein the circuitry comprises at least one mixer that mixes the input signal and the power supply.

8. The system according to claim 1, wherein the input signal comprises a sinusoidal signal.

9. The system according to claim 1, wherein the output signal comprises a sinusoidal signal modulated with the noise associated with the power supply.

10. A method for measuring noise associated with an on-chip power supply, the method comprising:

receiving on chip, an input signal;

combining on chip, the input signal and a power supply output signal generated by the on-chip power supply;

generating on chip, an output signal comprising the combined input signal and the power supply output signal, wherein the output signal indicates characteristics of the noise associated with the power supply;

demodulating the output signal with the input signal to extract the noise associated with the power supply.

11. The method according to claim 10, wherein combining the input signal and the power supply output signal comprises running the input signal through a delay line powered by the power supply.

12. The method according to claim 11, wherein the delay line comprises a plurality of inverters in series, wherein the input signal is input into the first of the plurality of inverters, and each of the plurality of inverters is powered by the power supply.

13. The method according to claim 11, wherein the input signal comprises a square wave.

14. The method according to claim 11, wherein the output signal comprises a combination of delayed versions of the input signal.

15. The method according to claim 14, comprising analyzing the output signal to determine the characteristics of the noise associated with the power supply.

16. The method according to claim 10, wherein the characteristics of the noise associated with the power supply comprise a magnitude and spectrum of the noise in the frequency domain.

17. The method according to claim 10, wherein combining the input signal and the power supply output signal comprises mixing the input signal and the power supply output signal.

18. The method according to claim 10, wherein the input signal comprises a sinusoidal signal and the output signal comprises the sinusoidal signal modulated with the noise associated with the power supply.

19. An on-chip noise measurement system that measures noise associated with an on-chip power supply, the system comprising:

an on-chip measurement module comprising:

a first input port and an output port;

a second input port coupled to the on-chip power supply; and combining circuitry coupled to the first input port, the second input port, and the output port, wherein the combining circuitry comprises a plurality of serially coupled inverters that are coupled between the first input port and the output port each of the plurality of inverters is coupled to the on-chip power supply and powered therefrom, and wherein the combining circuitry demodulates an output signal at the output port with an input signal at the first input port to extract noise associated with the on-chip power supply.

* * * * *